United States Patent
Yonemura et al.

(10) Patent No.: US 10,879,697 B2
(45) Date of Patent: Dec. 29, 2020

(54) POWER CONVERSION DEVICE AND TEST METHOD THEREOF

(71) Applicant: TOSHIBA MITSUBISHI-ELECTRIC INDUSTRIAL SYSTEMS CORPORATION, Chuo-ku (JP)

(72) Inventors: Naoki Yonemura, Chuo-ku (JP); Taichiro Tsuchiya, Chuo-ku (JP)

(73) Assignee: TOSHIBA MITSUBISHI-ELECTRIC INDUSTRIAL SYSTEMS CORPORATION, Chuo-ku (JP)

( * ) Notice: Subject to any disclaimer, the term of this patent is extended or adjusted under 35 U.S.C. 154(b) by 0 days.

(21) Appl. No.: 16/492,752

(22) PCT Filed: Mar. 29, 2017

(86) PCT No.: PCT/JP2017/012943
§ 371 (c)(1),
(2) Date: Sep. 10, 2019

(87) PCT Pub. No.: WO2018/179145
PCT Pub. Date: Oct. 4, 2018

(65) Prior Publication Data
US 2020/0076323 A1    Mar. 5, 2020

(51) Int. Cl.
*H02M 1/32* (2007.01)
*H02J 3/00* (2006.01)
(Continued)

(52) U.S. Cl.
CPC ........ *H02J 3/0012* (2020.01); *G01R 31/3187* (2013.01); *G05F 1/70* (2013.01);
(Continued)

(58) Field of Classification Search
CPC ...... G01R 31/3187; H02M 2007/4835; H02M 1/32; H02J 3/0012; H02J 3/1857; H02H 3/335
See application file for complete search history.

(56) References Cited

U.S. PATENT DOCUMENTS

| | | | |
|---|---|---|---|
| 2009/0059631 A1* | 3/2009 | Krein | H02M 1/32 363/95 |
| 2009/0121726 A1* | 5/2009 | Hashimoto | G01R 31/31721 324/537 |

(Continued)

FOREIGN PATENT DOCUMENTS

| WO | WO 2017/013125 A1 | 1/1917 |
|---|---|---|
| WO | WO 2012/099176 A1 | 7/2012 |

OTHER PUBLICATIONS

International Search Report dated May 30, 2017 in PCT/JP2017/012943 filed Mar. 29, 2017.

(Continued)

*Primary Examiner* — Harry R Behm
(74) *Attorney, Agent, or Firm* — Oblon, McClelland, Maier & Neustadt, L.L.P.

(57) ABSTRACT

In a power conversion device, an inverter (10) of each of three arms (A1 to A3) is controlled such that circulating current (Iz) of three arms (A1 to A3) follows a reference (Izrt) in a test period (times t3 to t4) in which a power system (1) is cut off from the three arms (A1 to A3), and whether the power conversion device is normal is determined based on circulating current (Iz) in the test period. Whether the power conversion device is normal therefore can be determined without affecting the power system (1).

10 Claims, 13 Drawing Sheets

(51) Int. Cl.
*G01R 31/3187* (2006.01)
*G05F 1/70* (2006.01)
*H02J 3/18* (2006.01)
*H02M 7/483* (2007.01)
*H02H 3/33* (2006.01)

(52) U.S. Cl.
CPC ............ *H02H 3/335* (2013.01); *H02J 3/1857* (2013.01); *H02M 1/32* (2013.01); *H02M 2007/4835* (2013.01)

(56) References Cited

U.S. PATENT DOCUMENTS

| | | | |
|---|---|---|---|
| 2014/0077767 A1* | 3/2014 | Hasler | H02J 7/00 320/128 |
| 2016/0164399 A1* | 6/2016 | Mueller | H02M 1/4216 323/207 |
| 2016/0218513 A1* | 7/2016 | Myller | H02M 7/44 |
| 2017/0085193 A1* | 3/2017 | Akagi | H02M 7/537 |
| 2018/0145579 A1* | 5/2018 | Spudic | H02M 1/12 |
| 2019/0288509 A1* | 9/2019 | Buchmann | H02J 3/1857 |

OTHER PUBLICATIONS

Extended Search Report dated Oct. 23, 2020 in Europe Patent Application No. 17904129.8—1201/3605823 PCT/JP2017012943; 10 pgs.
Daniel Siemaszko, et al.: "Implementation and Experimental Set-Up of a Modular Multilevel Converter in a Multi Terminal DC/AC Transmission Network"; 2016 18th European Conference on Power Electronics and Applications. Jointly Owned by IEEE-PELS and EPE Association; Sep. 5, 2016; XP032985302; 12 pgs.

\* cited by examiner

FIG.9
(A)
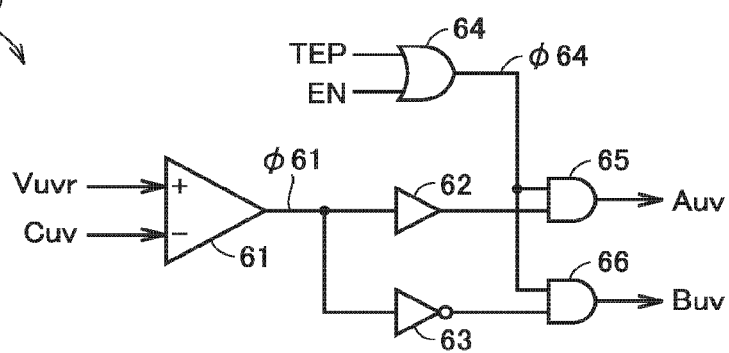
(B)
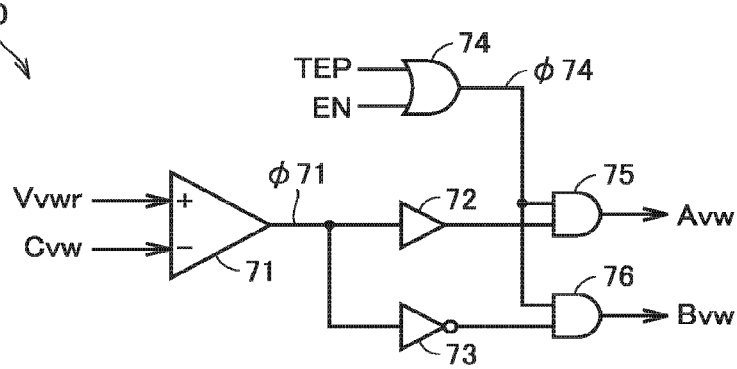
(C)
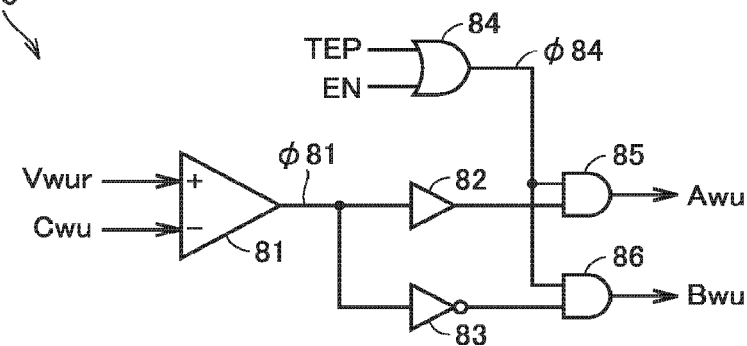

US 10,879,697 B2

POWER CONVERSION DEVICE AND TEST METHOD THEREOF

TECHNICAL FIELD

The present invention relates to a power conversion device and a test method thereof, more specifically to a power conversion device including delta-connected three arms and a test method thereof.

BACKGROUND ART

WO 2012/099176 (PTL 1) discloses a power conversion device called MMCC (Modular Multilevel Cascade Converter). This power conversion includes delta-connected three arms. Each arm includes a plurality of capacitors and a plurality of cascaded inverters. Each capacitor stores direct-current (DC) power. Each inverter converts DC power of the corresponding capacitor into alternating-current (AC) power. This power conversion device is used, for example, as a reactive power compensator for a power system.

CITATION LIST

Patent Literature

PTL 1: WO 2012/099176

SUMMARY OF INVENTION

Technical Problem

Unfortunately, when such a power conversion device is connected to a power system and the operation is started, the power conversion device sometimes does not operate normally and adversely affects the power system.

A main object of the present invention is therefore to provide a power conversion device capable of determining whether it operates normally without affecting the power system, and a test method thereof.

Solution to Problem

A power conversion device according to the present invention includes delta-connected three arms. Each of the three arms includes a capacitor configured to store DC power and an inverter configured to convert DC power into AC power. The power conversion device further includes a first controller configured to control the inverter of each of the three arms such that circulating current of the three arms follows a first reference in a test period in which a power system is cut off from the three arms, and a second controller configured to control the inverter of each of the three arms such that electric power transferred between the power system and the three arms follows a second reference in normal operation in which there is electrical continuity between the power system and the three arms. Whether the power conversion device is normal is determined based on the circulating current in the test period.

Advantageous Effects of Invention

In the power conversion device according to the present invention, the inverter of each of the three arms is controlled such that circulating current of the three arms follows the first reference in a test period in which the power system is cut off from the three arms, and whether the power conversion device is normal is determined based on the circulating current in the test period. Whether the power conversion device is normal therefore can be determined without affecting the power system.

BRIEF DESCRIPTION OF DRAWINGS

FIG. 9 is a circuit diagram showing a configuration of a gate signal generation circuit included in the control device shown in FIG. 1.

DESCRIPTION OF EMBODIMENTS

Figure 1:
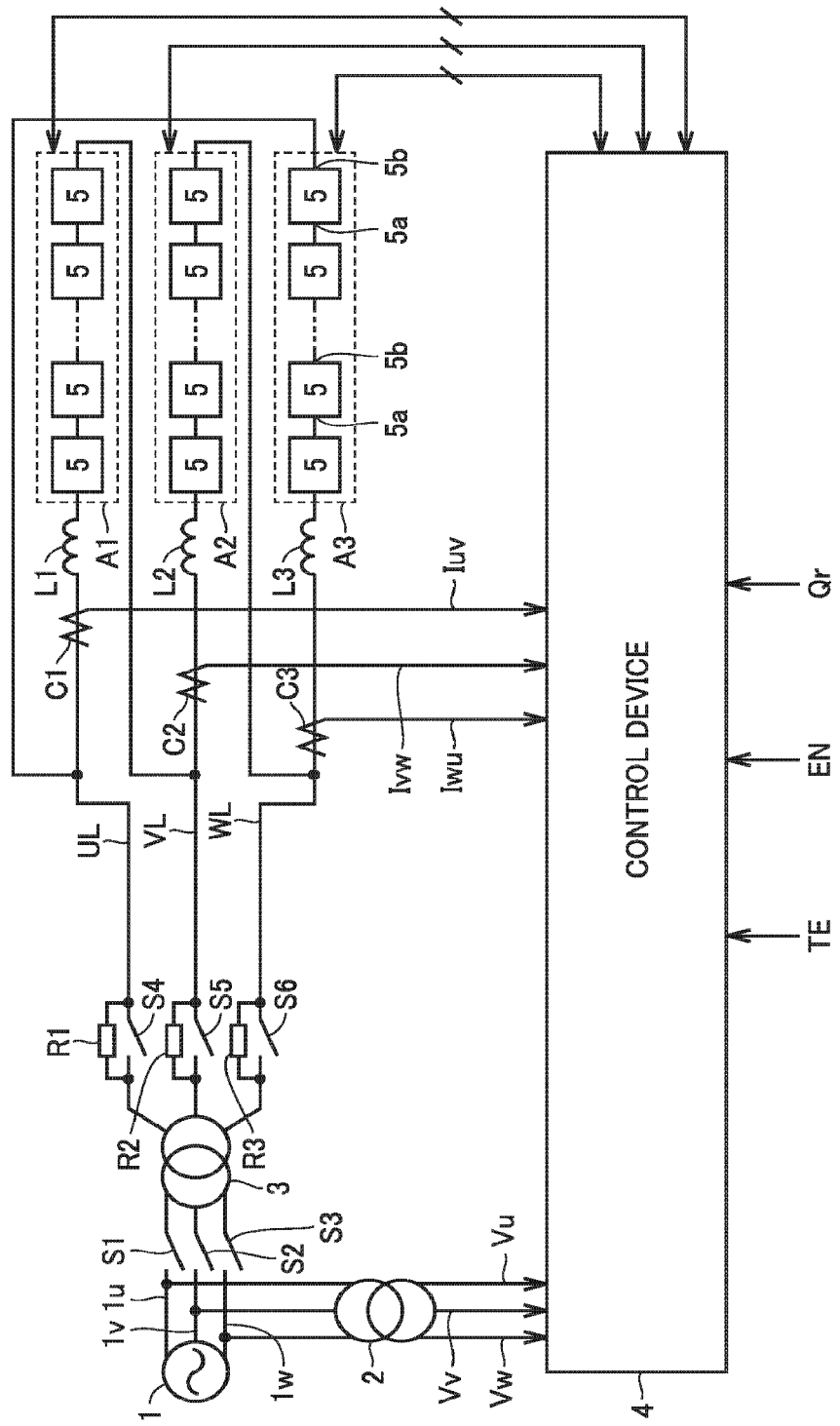
FIG. 1 is a circuit block diagram showing a configuration of a power conversion device according to an embodiment of the present invention.

FIG. 1 is a circuit block diagram showing a configuration of a power conversion device according to an embodiment of the present invention. In FIG. 1, this power conversion device is used as a reactive power compensator that compensates for reactive power of a power system 1 and includes switches S1 to S6, transformers 2 and 3, current-limiting resistors R1 to R3, AC lines UL, VL, and WL, current transformers C1 to C3, reactors L1 to L3, arms A1 to A3, and a control device 4. Each of arms A1 to A3 includes a plurality of cascaded unit converters 5.

Transformer 2 applies AC voltages Vu, Vv, and Vw having values corresponding to AC voltages of three phase power transmission lines $1u$, $1v$, and $1w$ of power system 1 to control device 4. Each of switches S1 to S3 has one terminal connected to the corresponding one of power transmission lines $1u$, $1v$, and $1w$ and the other terminal connected to the corresponding one of three primary windings of transformer 3. Switches S1 to S3 are turned on in a charge period in which initial charging of the capacitors included in the unit converters 5 is performed and are turned off in a test period for testing whether the power conversion device operates normally. Switches S1 to S3 are turned on in normal operation of the power conversion device and turned off, for example, during maintenance of the power conversion device.

Transformer 3 includes three primary windings and three secondary windings and transfers three-phase AC power. Each of current-limiting resistors R1 to R3 has one terminal connected to the corresponding one of three secondary windings of transformer 3 and the other terminal connected to one terminal of the corresponding one of AC lines UL, VL, and WL. Current-limiting resistors R1 to R3 limit current flowing from power system 1 to arms A1 to A3 in a charge period in which initial charging of the capacitors included in unit converters 5 is performed.

Switches S4 to S6 are connected in parallel with current-limiting resistors R1 to R3, respectively, and turned on after current flowing from power system 1 through arms A1 to A3 becomes stable in the initial charge period. Switches S4 to S6 are turned on in normal operation and turned off, for example, during maintenance of the power conversion device.

Reactor L1 and arm A1 are connected in series between the other terminal of AC line UL and the other terminal of AC line VL. Reactor L2 and arm A2 are connected in series between the other terminal of AC line VL and the other terminal of AC line WL. Reactor L3 and arm A3 are connected in series between the other terminal of AC line WL and the other terminal of AC line UL. That is, arms A1 to A3 are delta-connected.

Reactors L1 to L3 suppress circulating current flowing through arms A1 to A3. Arms A1 to A3 are controlled by control device 4 to generate three-phase AC power. Current detectors C1 to C3 feed back AC currents Iuv, Ivw, and Iwu having values corresponding to AC currents flowing through arms A1 to A3, respectively, to control device 4. Unit converter 5 generates AC power in accordance with a gate signal from control device 4.

Figure 2:
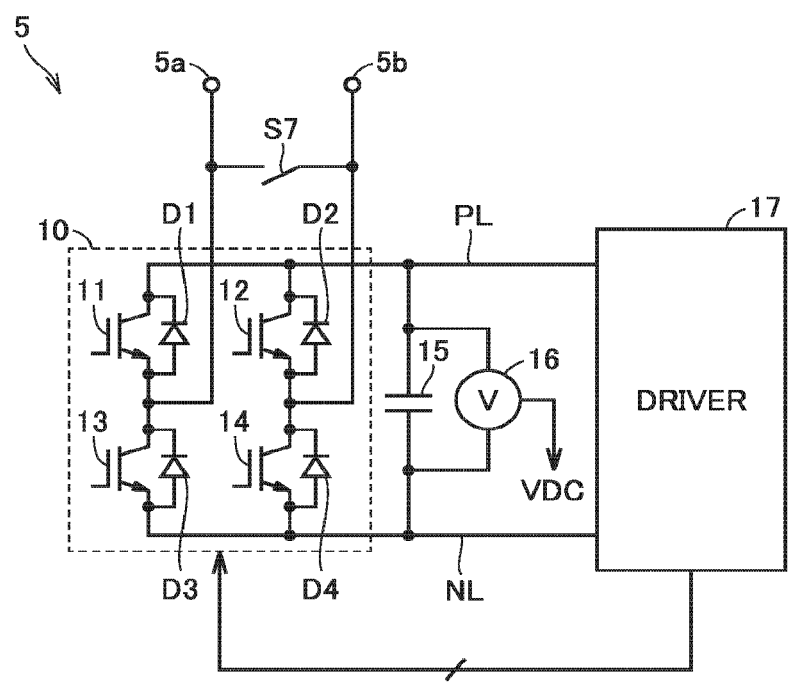
FIG. 2 is a circuit block diagram showing a configuration of a unit converter shown in FIG. 1.

FIG. 2 is a circuit block diagram showing a configuration of unit converter 5. In FIG. 2, unit converter 5 includes AC terminals 5a and 5b, a switch S7, an inverter 10, DC lines PL and NL, a capacitor 15, a voltage detector 16, and a driver 17.

AC terminals 5a of unit converters 5 on the first stage of arms A1 to A3 are respectively connected to the other terminals of AC lines UL, VL, and WL through reactors L1 to L3. AC terminals 5b of unit converters 5 on the final stage of arms A1 to A3 are respectively connected to the other terminals of AC lines VL, WL, and UL. AC terminal 5a of each of the other unit converters 5 is connected to AC terminal 5b of unit converter 5 on the previous stage, and AC terminal 5b is connected to AC terminal 5a of unit converter 5 on the next stage.

Switch S7 is connected between AC terminals 5a and 5b and controlled, for example, by control device 4. Switch S7 is turned off when the corresponding unit converter 5 is normal and is turned on when the corresponding unit converter 5 is failed. When switch S7 is turned on, a short circuit occurs between AC terminals 5a and 5b and the corresponding unit converter 5 is bypassed.

Inverter 10 includes IGBTs (Insulated Gate Bipolar Transistors) 11 to 14 and diodes D1 to D4. The collectors of IGBTs 11 and 12 are both connected to the positive-side DC line PL and the emitters thereof are connected to AC terminals 5a and 5b, respectively. The collectors of IGBTs 13 and 14 are respectively connected to AC terminals 5a and 5b and the emitters thereof are both connected to the negative-side DC line NL. Each of IGBTs 11 to 14 is driven by driver 17. Diodes D1 to D4 are respectively connected in anti-parallel with IGBTs 11 to 14. In each of arms A1 to A3, a plurality of inverters 10 are cascaded.

Inverter 10 is controlled by control device 4 and transfers power between power system 1 and capacitor 15. Capacitor 15 is connected between DC lines PL and NL and stores DC power. Inverter 10 converts DC power of capacitor 15 into AC power and outputs the converted power between AC terminals 5a and 5b. The amplitude and the phase of AC voltage output between AC terminals 5a and 5b from inverter 10 are controllable. Voltage detector 16 outputs DC voltage VDC having a value corresponding to DC voltage between the terminals of capacitor 15 to control device 4.

Driver 17 is connected to DC lines PL and NL and is driven by DC power stored in capacitor 15. Driver 17 operates inverter 10 in response to a gate signal from control device 4.

Returning to FIG. 1, control device 4 controls each of three arms A1 to A3 (that is, each of a plurality of unit converters 5), based on external test signal TE, activation signal EN, and reactive power reference Qr, AC voltages Vu, Vv, and Vw from transformer 3, and AC currents Iuv, Ivw, and Iwu from current detectors C1 to C3.

Test signal TE is a signal asserted to "H" level that is the activation level in a test mode for testing whether the power conversion device operates normally, otherwise deasserted to "L" level that is the deactivation level. Activation signal EN is a signal asserted to "H" level that is the activation level in a normal mode that allows the power conversion device to perform normal operation, otherwise deasserted to "L" level that is the deactivation level.

Test signal TE and activation signal EN are applied, for example, from the user of the power conversion device to control device 4. Reactive power reference Qr is applied, for example, from the central control center (not shown) of power system 1. The power conversion device supplies reactive power having a value corresponding to reactive power command Qr to power system 1.

Figure 3:
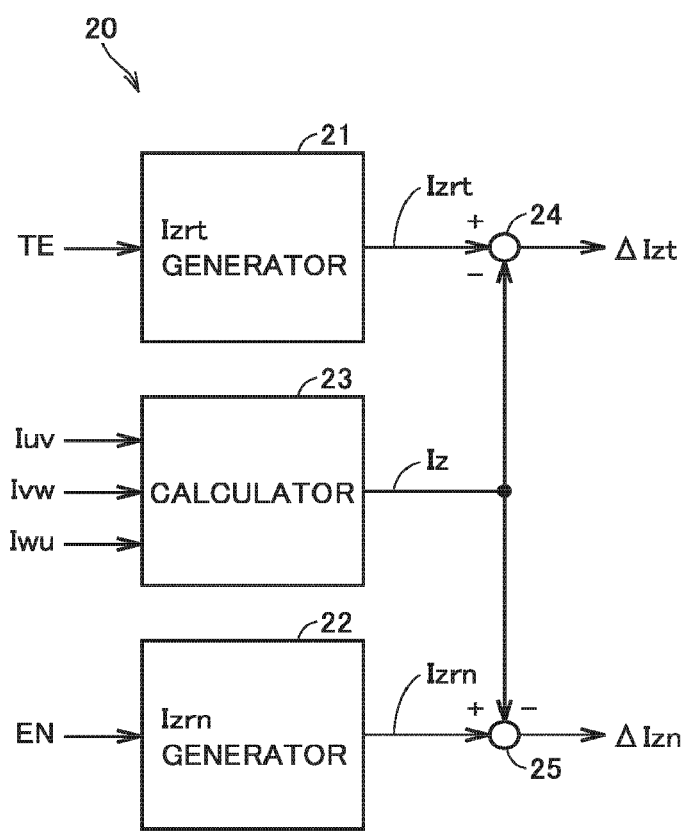
FIG. 3 is a block diagram showing a configuration of a circulating current controller included in the control device shown in FIG. 1.

FIG. 3 is a block diagram showing a configuration of a circulating current controller 20 included in control device 4. In FIG. 3, circulating current controller 20 includes an Izrt generator 21, an Izrn generator 22, a calculator 23, and subtractors 24 and 25.

Izrt generator 21 is activated when test signal TE is asserted to "H" level and generates circulating current reference Izrt for test mode. Izrn generator 22 is activated when activation signal EN is asserted to "H" level and generates circulating current reference Izrn for normal mode.

Calculator 23 obtains circulating current Iz flowing through arms A1 to A3 based on three phase AC currents Iuv, Ivw, and Iwu from current detectors C1 to C3. Iz is the average value of Iuv, Ivw, and Iwu and obtained based on a formula $Iz=(Iuv+Ivw+Iwu)/3$.

Subtractor 24 outputs deviation $\Delta Izt=Izrt-Iz$ between circulating current reference Izrt for test mode and circulating current Iz. Subtractor 25 outputs deviation $\Delta Izn=Izrn-Iz$ between circulating current reference Izrn for normal mode and circulating current Iz.

Figure 4:
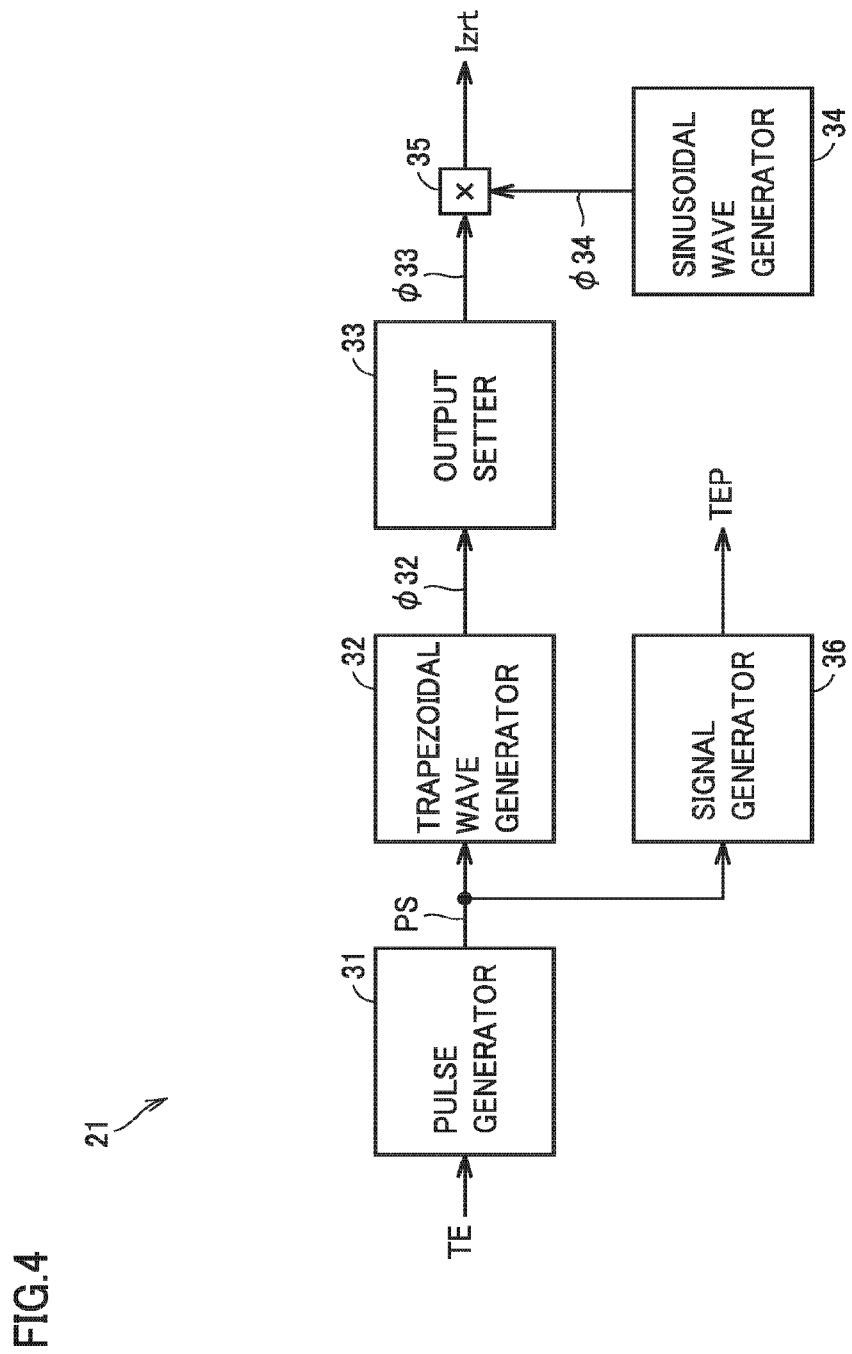
FIG. 4 is a block diagram showing a configuration of an Izrt generator shown in FIG. 3.

FIG. 4 is a block diagram showing a configuration of Izrt generator 21 shown in FIG. 3. In FIG. 4, Izrt generator 21 includes a pulse generator 31, a trapezoidal wave generator 32, an output setter 33, a sinusoidal wave generator 34, a multiplier 35, and a signal generator 36.

Figure 5:
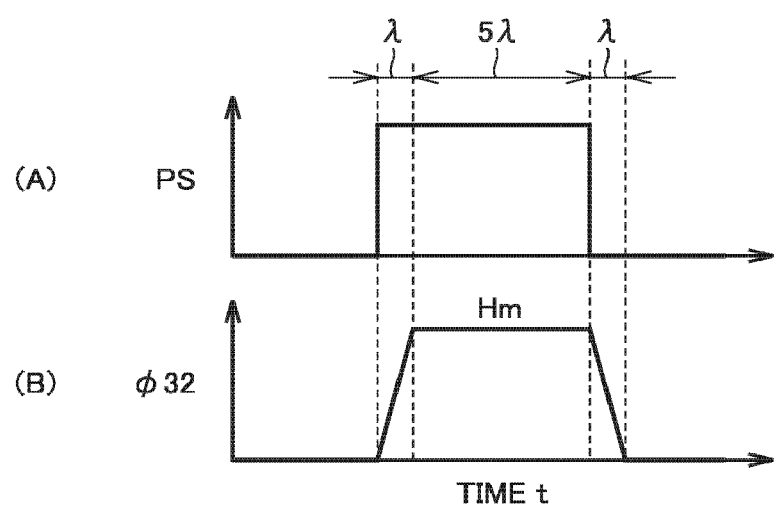
FIG. 5 is a time chart showing the waveforms of a positive pulse signal and a trapezoidal wave signal shown in FIG. 4.

Pulse generator 31 outputs positive pulse signal PS in response to test signal TE being raised from "L" level that is the deactivation level to "H" level that is the activation level. The pulse width of positive pulse signal PS is set to, for example, a time six times ($=6\lambda$) longer than one cycle X of three-phase AC power, as shown in FIG. 5(A). For example, $6\lambda$ is 0.1 second.

Trapezoidal wave generator 32 generates trapezoidal wave signal φ32 by reducing the inclination of rise and fall of positive pulse signal PS. When the maximum value of trapezoidal wave signal φ32 is Hm, as shown in FIG. 5(B), for example, the level of trapezoidal wave signal φ32 is raised from zero to Hm over a time of one cycle $\lambda$ of three-phase AC power and lowered from Hm to zero over a time of one cycle $\lambda$. In this case, the width of the bottom base of the waveform of trapezoidal wave signal φ22 is $7\lambda$ and the width of the top base is $5\lambda$.

Returning to FIG. 4, output setter 33 sets a peak value of circulating current Iz from height Hm of trapezoidal wave signal φ32. The peak value of circulating current Iz is set to, for example, 20% of the rating value. Sinusoidal wave generator 34 outputs unit sinusoidal wave signal φ34 having the same cycle $\lambda$ as three-phase AC power. Multiplier 35 multiplies output signal φ33 of output setter 33 by unit sinusoidal wave signal φ34 from sinusoidal wave generator 34 to generate circulating current reference Izrt for test mode. Signal generator 36 outputs test pulse signal TEP having the same pulse width ($7\lambda$) as the bottom base of trapezoidal wave signal φ32, in response to positive pulse signal PS.

Figure 6:
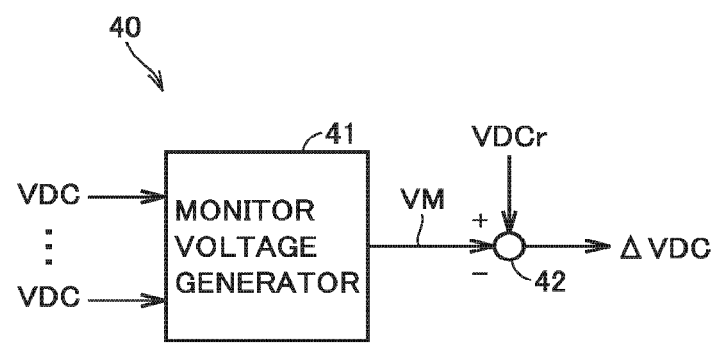
FIG. 6 is a block diagram showing a configuration of a DC voltage controller included in the control device shown in FIG. 1.

FIG. 6 is a block diagram showing a configuration of DC voltage controller 40 included in control device 4. In FIG. 6, DC voltage controller 40 includes a monitor voltage generator 41 and a subtractor 42. Monitor voltage generator 41 generates monitor voltage VM based on DC voltages VDC applied from all the unit converters 5. Monitor voltage VM is, for example, set to the average value of DC voltages VDC applied from all the unit converters 5. Subtractor 42 generates deviation $\Delta VDC = VDCr - VM$ between DC voltage reference VDCr, which is a constant value, and monitor voltage VM.

Figure 7:
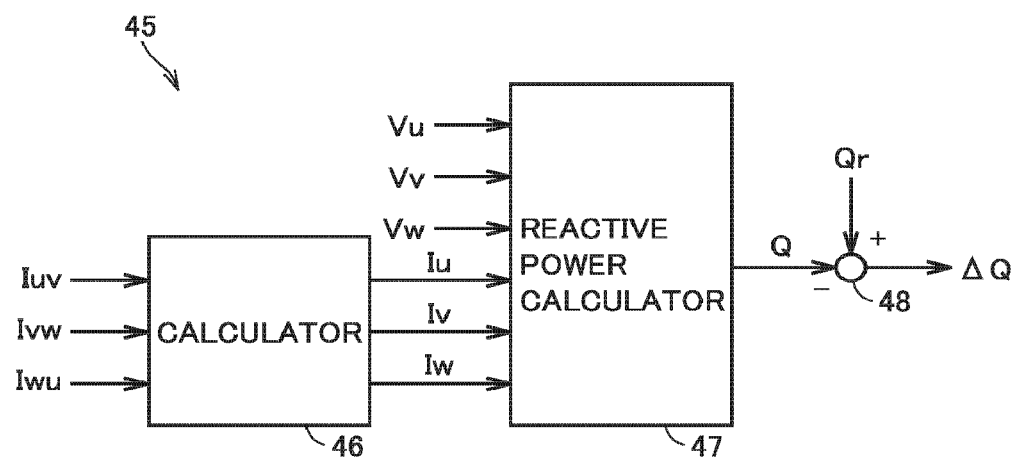
FIG. 7 is a block diagram showing a configuration of a reactive power controller included in the control device shown in FIG. 1.

FIG. 7 is a block diagram showing a configuration of reactive power controller 45 included in control device 4. In FIG. 7, reactive power controller 45 includes a calculator 46, a reactive power calculator 47, and a subtractor 48.

Calculator 46 obtains AC currents Iu, Iv, and Iw at levels corresponding to AC currents flowing through AC lines UL, VL, and WL, based on AC currents Iuv, Ivw, and Iwu from current detectors C1 to C3. Here, Iu=Iuv−Iwu, Iv=Ivw−Iuv, and Iw=Iwu−Ivw.

Reactive power calculator 47 obtains reactive power Q based on three phase AC voltages Vu, Vv, and Vw from transformer 2 and three phase AC currents Iu, Iv, and Iw from calculator 46. Subtractor 48 obtains deviation $\Delta Q = Qr - Q$ between reactive power command Qr and reactive power Q.

Figure 8:
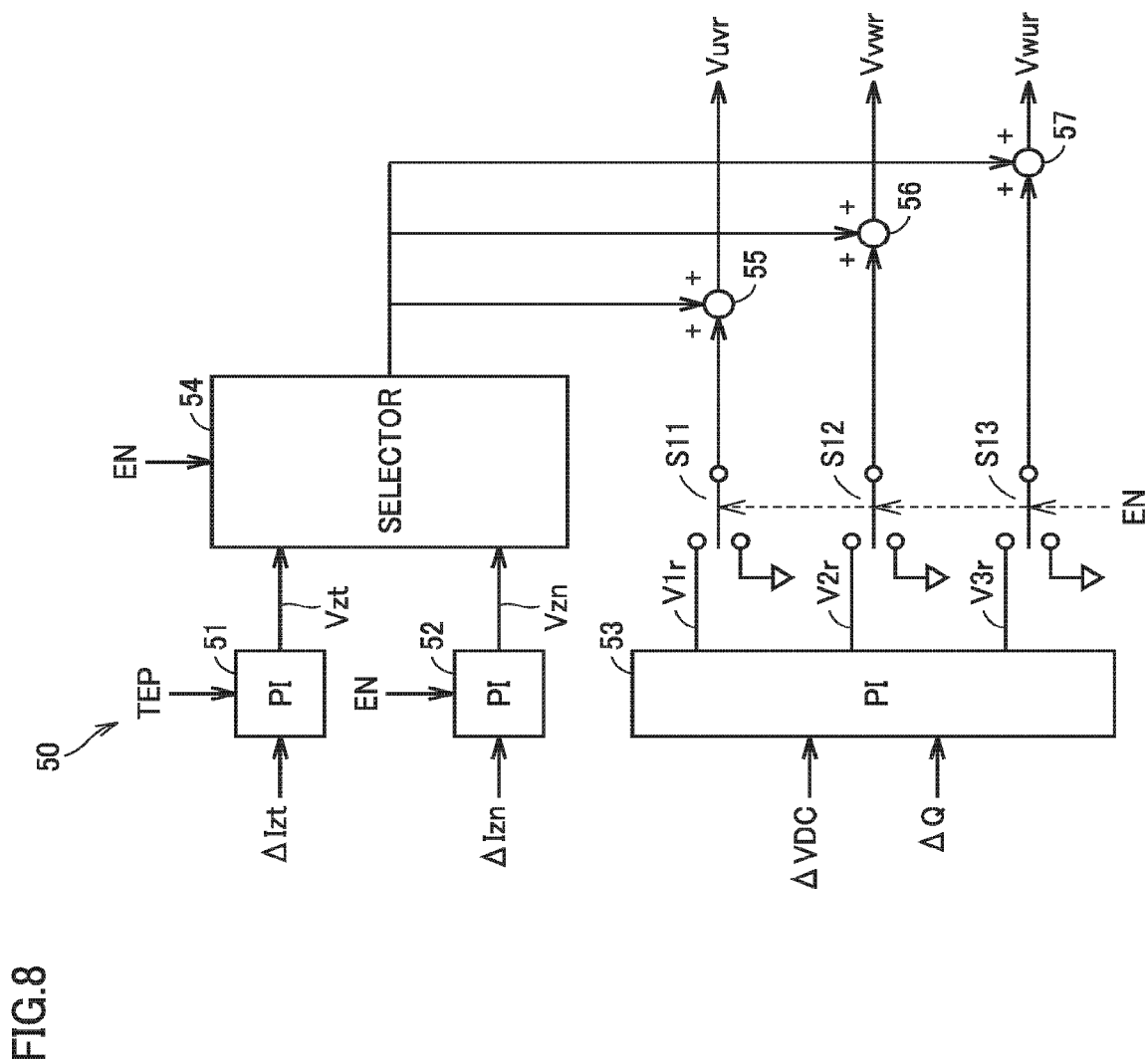
FIG. 8 is a block diagram showing a configuration of a voltage command unit included in the control device shown in FIG. 1.

FIG. 8 is a block diagram showing a configuration of a voltage command unit 50 included in control device 4. In FIG. 8, voltage command unit 50 includes a PI (Proportional Integral) controllers 51 to 53, a selector 54, switches S11 to S13, and adders 55 to 57.

When test pulse signal TEP is at "H" level that is the activation level, PI controller 51 is activated and adds a value proportional to deviation ΔIzt from circulating current controller 20 (FIG. 3) to a value of integral of deviation ΔIzt to generate AC voltage reference Vzt for test mode. When test pulse signal TEP is at "L" level that is the deactivation level, PI controller 51 is deactivated and AC voltage reference Vzr is reset to zero.

When activation signal EN is at "H" level that is the activation level, PI controller 52 is activated and adds a value proportional to deviation ΔIzn from circulating current controller 20 (FIG. 3) to a value of integral of deviation ΔIzn to generate AC voltage reference Vzn for normal mode. When activation signal EN is at "L" level that is the deactivation level, PI controller 52 is deactivated and AC voltage reference Vzn is reset to zero.

Selector 54 applies AC voltage reference Vzt for test mode to each of adders 55 to 57 when activation signal EN is at "L" level, and applies AC voltage reference Vzn for normal mode to each of adders 55 to 57 when activation signal EN is at "H" level.

PI controller 53 generates three phase AC voltage references V1r, V2r, and V3r, based on a value obtained by adding a value proportional to deviation ΔVDC from DC voltage controller 40 (FIG. 6) to a value of integral of deviation ΔVDC, and a value obtained by adding a value proportional to deviation ΔQ from reactive power controller 45 (FIG. 7) to a value of integral of deviation ΔQ.

Switches S11, S12, and S13 apply three phase AC voltage references V1r, V2r, and V3r to adders 55, 56, and 57, respectively, when activation signal EN is at "H" level, and applies AC voltage reference "0" to adders 55, 56, and 57 when activation signal EN is at "L" level.

Adder 55 adds AC voltage reference Vzn or Vzt from selector 54 to AC voltage reference V1r or zero from switch S11 to generate AC voltage reference Vuvr. Adder 56 adds AC voltage reference Vzn or Vzt from selector 54 to AC voltage reference V2r or zero from switch S12 to generate AC voltage reference Vvwr. Adder 57 adds AC voltage reference Vzn or Vzt from selector 54 to AC voltage reference V3r or zero from switch S13 to generate AC voltage reference Vwur.

Accordingly, three phase AC voltage references Vuvr, Vvwr, and Vwur in the normal mode are Vzn+V1r, Vzn+V2r, and Vzn+V3r, respectively, and all of three phase AC voltage references Vuvr, Vvwr, and Vwur in the test mode are Vzt.

FIGS. 9(A), 9(B), and 9(C) are circuit diagrams showing a configuration of gate signal generation circuits 60, 70, and 80 included in control device 4. Gate signal generation circuits 60, 70, and 80 correspond to drivers 17 of unit converters 5 belonging to arms A1 to A3, respectively.

As shown in FIG. 9(A), gate signal generation circuit 60 includes a comparator 61, a buffer 62, an inverter 63, an OR gate 64, and AND gates 65 and 66. Comparator 61 compares the level of AC voltage reference Vuvr with the level of carrier signal Cuv and outputs signal φ61 at a level corresponding to the comparison result. Carrier signal Cuv is a triangular wave signal having a frequency higher than AC voltage reference Vuvr and synchronized with AC voltage reference Vuvr.

When Vuvr>Cuv, signal φ61 goes to "H" level, and when Vuvr<Cuv, signal φ61 goes to "L" level. Buffer 62 delays signal φ61. Inverter 63 inverts signal φ61. OR gate 64 outputs OR signal φ64 of test pulse signal TEP and activation signal EN.

AND gate 65 outputs an AND signal of an output signal from buffer 62 and output signal φ64 from OR gate 64, as gate signal Auv. When one of test pulse signal TEP and activation signal EN is at "H" level, an output signal from buffer 62 passes through AND gate 65 to become gate signal Auv. When both of test pulse signal TEP and activation signal EN are at "L" level, gate signal Auv is fixed to "L" level.

AND gate 66 outputs an AND signal of an output signal from inverter 63 and output signal φ64 from OR gate 64 as gate signal Buv. When one of test pulse signal TEP and activation signal EN is at "H" level, an output signal from inverter 63 passes through AND gate 66 to become gate signal Buv. When both of test pulse signal TEP and activation signal EN are at "L" level, gate signal Buv is fixed to "L" level.

As shown in FIG. 9(B), gate signal generation circuit 70 includes a comparator 71, a buffer 72, an inverter 73, an OR gate 74, and AND gates 75 and 76. Comparator 71 compares the level of AC voltage reference Vvwr with the level of carrier signal Cvw and outputs signal φ71 at a level corresponding to the comparison result. Carrier signal Cvw is a triangular wave signal having a frequency higher than AC voltage reference Vvwr and synchronized with AC voltage reference Vvwr.

When Vvwr>Cvw, signal φ71 goes to "H" level, and when Vvwr<Cvw, signal φ71 goes to "L" level. Buffer 72 delays signal φ71. Inverter 73 inverts signal φ71. OR gate 74 outputs OR signal φ74 of test pulse signal TEP and activation signal EN.

AND gate 75 outputs an AND signal of an output signal from buffer 72 and output signal φ74 from OR gate 74, as gate signal Avw. When one of test pulse signal TEP and activation signal EN is at "H" level, an output signal from buffer 72 passes through AND gate 75 to become gate signal Avw. When both of test pulse signal TEP and activation signal EN are at "L" level, gate signal Avw is fixed to "L" level.

AND gate 76 outputs an AND signal of an output signal from inverter 73 and output signal φ74 from OR gate 74, as gate signal Bvw. When one of test pulse signal TEP and activation signal EN is at "H" level, an output signal from inverter 73 passes through AND gate 76 to become gate signal Bvw. When both of test pulse signal TEP and activation signal EN are at "L" level, gate signal Bvw is fixed to "L" level.

As shown in FIG. 9(C), gate signal generation circuit 80 includes a comparator 81, a buffer 82, an inverter 83, an OR gate 84, and AND gates 85 and 86. Comparator 81 compares the level of AC voltage reference Vwur with the level of carrier signal Cwu and outputs signal φ81 at a level corresponding to the comparison result. Carrier signal Cwu is a triangular wave signal having a frequency higher than AC voltage reference Vwur and synchronized with AC voltage reference Vwur.

When Vwur>Cwu, signal φ81 goes to "H" level, and when Vwur<Cwu, signal φ81 goes to "L" level. Buffer 82 delays signal φ81. Inverter 83 inverts signal φ81. OR gate 84 outputs OR signal φ84 of test pulse signal TEP and activation signal EN.

AND gate 85 outputs an AND signal of an output signal from buffer 82 and output signal φ84 from OR gate 84, as gate signal Awu. When one of test pulse signal TEP and activation signal EN is at "H" level, an output signal from buffer 82 passes through AND gate 85 to become gate signal Awu. When both of test pulse signal TEP and activation signal EN are at "L" level, gate signal Awu is fixed to "L" level.

AND gate 86 outputs an AND signal of an output signal from inverter 83 and an output signal φ84 from OR gate 84, as a gate signal Bwu. When one of test pulse signal TEP and activation signal EN is at "H" level, an output signal from inverter 83 passes through AND gate 86 to become gate signal Bwu. When both of test pulse signal TEP and activation signal EN are at "L" level, gate signal Bwu is fixed to "L" level.

FIGS. 10(A), 10(B), and 10(C) are time charts showing the waveforms of AC voltage reference Vuvr, carrier signal Cuv, and gate signals Auv and Buv shown in FIG. 9(A). It is assumed that output signal φ64 of OR gate 64 is set to "H" level.

As shown in FIG. 10(A), AC voltage reference Vuvr is a sinusoidal wave signal, and carrier signal Cuv is a triangular wave signal. The period of carrier signal Cuv is shorter than the period of AC voltage reference Vuvr, and the amplitude of carrier signal Cuv is larger than the amplitude of AC voltage reference Vuvr.

Figure 10:
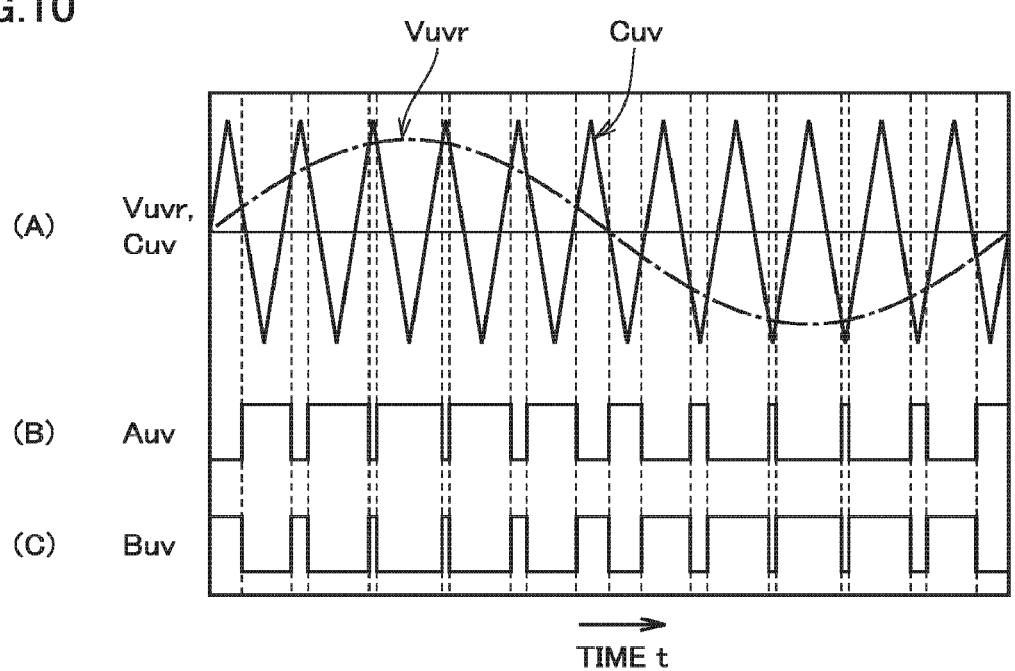
FIG. 10 is a time chart illustrating the waveforms of AC voltage reference Vuvr, carrier signal Cuv, and gate signals Auv and Buv shown in FIG. 9.

As shown in FIGS. 10(A) and 10(B), when the level of carrier signal Cuv is higher than AC voltage reference Vuvr, gate signal Auv goes to "L" level, and when the level of carrier signal Cuv is lower than AC voltage reference Vuvr, gate signal Auv goes to "H" level. Gate signal Auv is a positive pulse signal train. When AC voltage reference Vuvr has positive polarity, the pulse width of gate signal Auv is large, and when AC voltage reference Vuvr has negative polarity, the pulse width of gate signal Auv is small. As shown in FIGS. 10 (B) and 10(C), gate signal Buv is an inversion signal of gate signal Auv.

When gate signals Auv and Buv are at "H" level and "L" level, respectively, IGBTs 11 and 14 included in the corresponding inverter 10 turn on and IGBTs 12 and 13 turn off. In this case, in FIG. 2, the positive-side terminal (positive-side DC line PL) of capacitor 15 is connected to AC terminal 5a through IGBT 11, AC terminal 5b is connected to the negative-side terminal (negative-side DC line NL) of capacitor 15 through IGBT 14, and the terminal-to-terminal voltage of capacitor 15 is output between AC terminals 5a and 5b. In other words, a positive DC voltage is output between AC terminals 5a and 5b.

When gate signals Auv and Buv are at "L" level and "H" level, respectively, IGBTs 12 and 13 included in the corresponding inverter 10 turn on and IGBTs 11 and 14 turn off. In this case, the positive-side terminal (positive-side DC line PL) of capacitor 15 is connected to AC terminal 5b through IGBT 12, AC terminal 5a is connected to the negative-side terminal (negative-side DC line NL) of capacitor 15 through IGBT 13, and the terminal-to-terminal voltage of capacitor 15 is output between AC terminals 5b and 5a. In other words, a negative DC voltage is output between AC terminals 5a and 5b.

As shown in FIGS. 10(B) and 10(C), when the waveforms of gate signals Auv and Buv change, an AC voltage having the same phase as AC voltage reference Vuvr shown in FIG. 10(A) is output between AC terminals 5a and 5b. Since a plurality of unit converters 5 are cascaded in arm A1, an AC voltage having a value obtained by adding up AC voltages appearing between AC terminals 5a and 5b of a plurality of unit converters 5 appear between the terminals of arm A1.

When output signal φ64 of OR gate 64 is at "L" level, gate signals Auv and Buv are both fixed to "L" level, all of IGBTs 11 to 14 of the corresponding inverter 10 are turned off, and the operation of inverter 10 is stopped.

The waveforms of AC voltage reference Vvwr, carrier signal Cvw, and gate signals Avw and Bvw shown in FIG. 9(B) and the waveforms AC voltage reference Vwur, carrier signal Cwu, and gate signals Awu and Bwu shown in FIG. 9(C) are similar to the waveforms of AC voltage reference Vuvr, carrier signal Cuv, and gate signals Auv and Buv shown in FIGS. 10(A) to 10(C), and a description thereof is not repeated.

Figure 11:
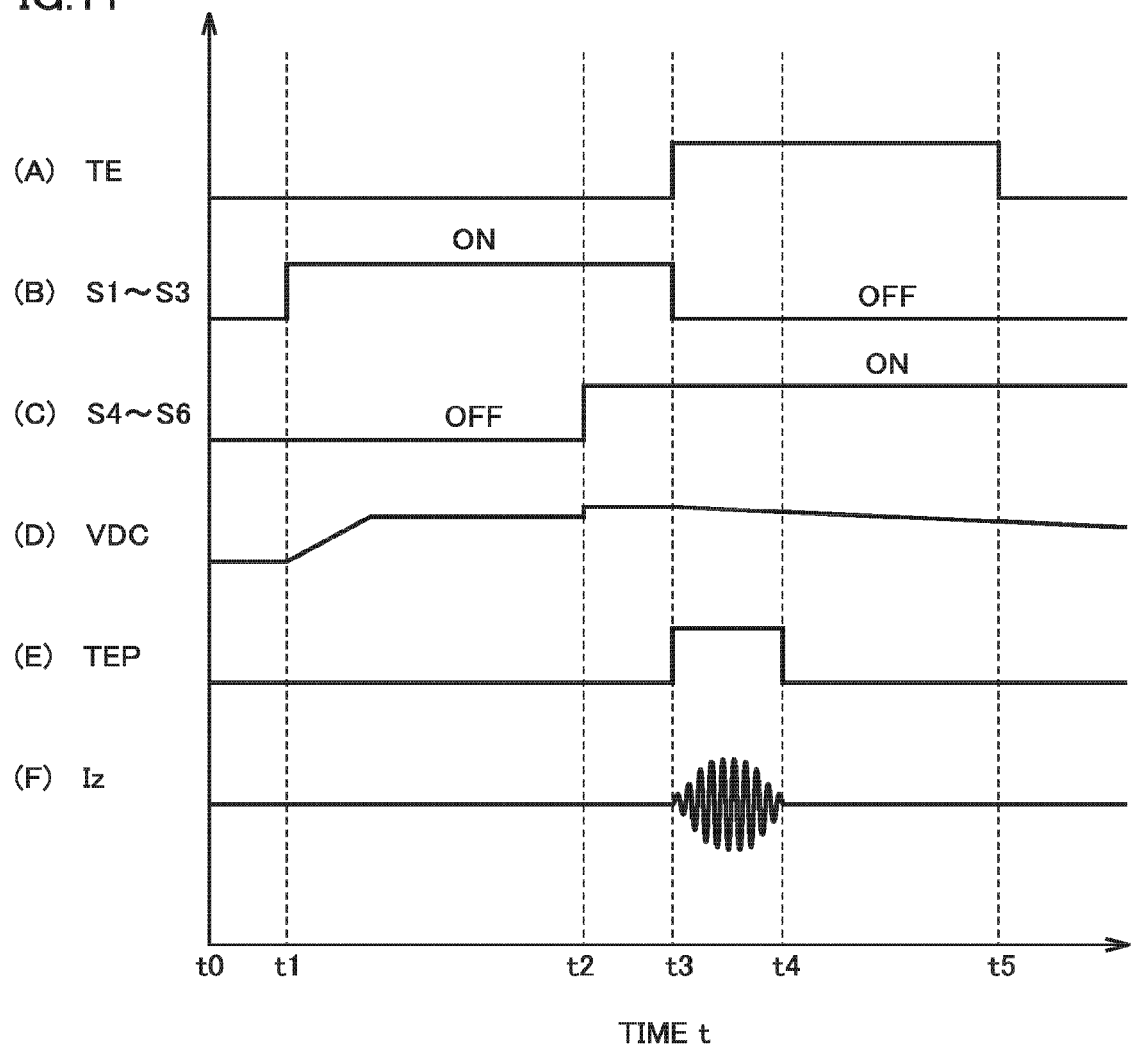
FIG. 11 is a time chart illustrating the operation of the power conversion device shown in FIG. 1 to FIG. 10.

FIGS. 11(A) to 11(F) are time charts showing the operation of the power conversion device shown in FIG. 1 to FIG. 10. More specifically, FIG. 11(A) shows the waveform of test signal TE, FIG. 11(B) shows the on/off state of switches S1 to S3, FIG. 11(C) shows the on/off state of switches S4 to S6, FIG. 11(D) shows DC voltage VDC of capacitor 15, FIG. 11(E) shows the waveform of test pulse signal TEP, and FIG. 11(F) shows the waveform of circulating current Iz.

As shown in FIG. 1, it is assumed that each of switches S1 to S3 has one terminal connected to the corresponding one of three phase transmission lines 1u, 1v, 1w of power system 1. In this state, if normal operation of arms A1 to A3 is started immediately after switches S1 to S3 and switches S4 to S6 are successively turn on to charge capacitor 15 of each unit converter 5, power system 1 is adversely affected in the case of a fault of the power conversion device.

Then, in the present embodiment, before normal operation of arms A1 to A3 is started, whether arms A1 to A3 operate normally is tested by flowing circulating current Iz to arms A1 to A3 in a state in which power system 1 is cut off from arms A1 to A3.

More specifically, in FIGS. 11(A) to 11(F), at the initial state (time t0), switches S1 to S6 are turned off, and power system 1 is cut off from arms A1 to A3. DC voltage VDC of capacitor 15 is 0 V, test signal TE and test pulse signal TEP are both set to "L" level that is the deactivation level, and circulating current Iz is 0 A. Activation signal EN is set to "L" level that is the deactivation level.

At certain time t1, switches S1 to S3 are turned on. Thus, current flows to capacitor 15 from power system 1 through switches S1 to S3, transformer 3, current-limiting resistors R1 to R3, AC lines UL, VL, and WL, reactors L1 to L3, and diodes D1 to D4 of each inverter 10, and DC voltage VDC of capacitor 15 gradually rises.

Next, at time t2, switches S4 to S6 are turned on. Thus, current-limiting resistors R1 to R3 are bypassed, and DC voltage VDC of capacitor 15 reaches the maximum value. It does not matter if testing is performed with switches S4 to S6 fixed to the off state, because driver 17 of unit converter 5 operates even when DC voltage VDC of capacitor 15 is lower than the maximum value.

At time t3, test signal TE is raised from "L" level that is the deactivation level to "H" level that is the activation level, switches S1 to S3 are turned off, and power system 1 is cut off from arms A1 to A3.

When test signal TE is raised to "H" level, positive pulse signal PS, trapezoidal wave signal φ22, test pulse signal TEP, circulating current reference Izrt, and deviation ΔIzt are generated in circulating current controller 20 (FIG. 3) and Izrt generator 21 (FIG. 4). When test pulse signal TEP is asserted to "H" level in response to test signal TE, PI controller 51 is activated in voltage command unit 50 (FIG. 8) so that circulating current deviation ΔIzt is PI-controlled to generate AC voltage reference Vzt.

Since activation signal EN is set at "L" level that is the deactivation level, PI controller 52 is deactivated, and AC voltage reference "0" is applied by switches S11 to S13 to adders 55 to 57. AC voltage reference Vzt generated in PI controller 52 passes through selector 54 and adders 55, 56, and 57 to become three phase AC voltage references Vuvr, Vvwr, and Vwur.

In gate signal generation circuits 60, 70, and 80 (FIGS. 9(A) to 9(C)), in a period during which test pulse signal TEP is set at "H" level, output signals φ64, φ74, and φ84 from OR gates 64, 74, and 84 go to "H" level, and each of AND gates 65, 66, 75, 76, 85, and 86 operates as a buffer.

Comparators 61, 71, and 81 compare the levels of three phase AC voltage references Vuvr, Vvwr, and Vwur with the levels of carrier signals Cuv, Cvw, and Cwu to generate signals φ61, φ71, and φ81. Signals φ61, φ71, and φ81 are delayed by buffers 62, 72, and 82 and passed through AND gates 65, 75, and 85 to become gate signals Auv, Avw, and Awu. Signals φ61, φ71, and φ81 are inverted by inverters 63, 73, and 83 and passed through AND gates 66, 76, and 86 to become gate signals Buv, Bvw, and Bwu.

All the inverters 10 of arms A1 to A3 are operated by these gate signals Auv, Buv, Avw, Bvw, Awu, and Bwu, and circulating current Iz is set to circulating current reference Izrt. As shown at times t3 to t4 in FIG. 11(F), circulating current Iz is controlled to gradually increase and thereafter gradually decrease.

When driver 17 operates and circulating current Iz flows, DC power in capacitor 15 is consumed, and DC voltage VDC gradually decreases. At time t5, test signal TE is lowered from "H" level to "L" level, and the test of the power conversion device ends.

The user of the power conversion device observes the waveform (amplitude, phase) of circulating current Iz, for example, using a waveform storing device and a monitor device, determines that the power conversion device is normal if the waveform is normal, and determines that the power conversion device is not normal if the waveform is not normal. For example, when any one of current detectors C1 to C3 is erroneously connected in a reverse direction, abnormal circulating current Iz flows and it is determined that the power conversion device is not normal.

Figure 12:
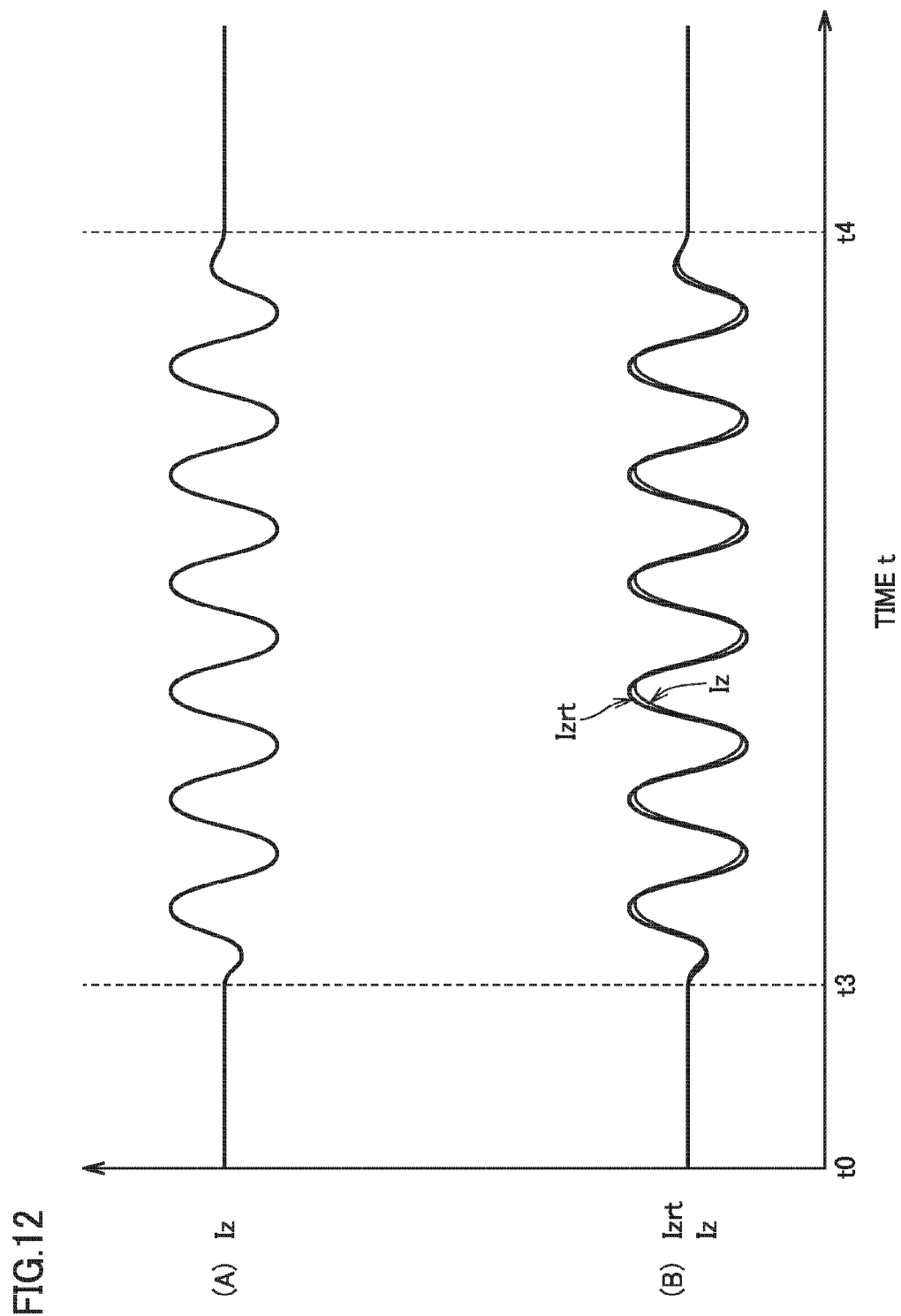
FIG. 12 is a time chart showing a simulation result of current reference Izr and circulating current Iz shown in FIG. 3.

FIGS. 12(A) and 12(B) are time charts illustrating a simulation result of current reference Izrt and circulating current Iz in a test period. Specifically, FIG. 12(A) shows the waveform of circulating current Iz, and FIG. 12(B) shows the waveforms of current reference Izrt and circulating current Iz. In this simulation, DC voltage VDC of capacitor 15 in a test period is kept at a constant value.

At times t1 to t2, the amplitude of current reference Izrt is gradually increased from zero to the maximum value in the first cycle (λ), the amplitude of current reference Izrt is kept at the maximum value in the next five cycles (5λ), and the amplitude of current reference Izrt is gradually decreased from the maximum value to zero in the last one cycle (λ). As shown in FIGS. 12(A) and 12(B), the amplitude and the phase of circulating current Iz change so as to follow the amplitude and the phase of current reference Izrt.

When the power conversion device is normal, as shown in FIG. 12(B), circulating current Iz changes similarly to current reference Izrt. When the power conversion device is not normal, circulating current Iz does not change similarly to current reference Izrt. Whether the power conversion device is normal therefore can be determined by observing the waveform of circulating current Iz.

The amplitude of current reference Izrt is gradually increased from zero to the maximum value and the amplitude of current reference Izrt is gradually decreased from the maximum value to zero, thereby preventing excessive circulating current Iz from flowing through arms A1 to A3.

If it is determined that the power conversion device is not normal as the result of the test, the failed part is identified and repaired. Repair and test are repeated until the power conversion device operates normally. If it is determined that the power conversion device is normal, the power conversion device is allowed to perform normal operation.

When the power conversion device is allowed to perform normal operation, as shown in FIGS. 11(B) and 11(C), switches S1 to S3 and switches S4 to S6 are successively turned on to charge capacitors 15. Once initial charging of capacitors 15 is finished, activation signal EN is raised from "L" level to "H" level to start normal operation. In normal operation, even after the initial charging of capacitors 15 is finished, switches S1 to S6 are kept in the on state, and electrical continuity between power system 1 and arms A1 to A3 is kept. Driver 17 in FIG. 2 is driven by DC power in capacitor 15.

In reactive power controller 45 (FIG. 7), reactive power Q is obtained by calculator 46 and reactive power calculator 47, and deviation ΔQ between reactive power reference Qr and reactive power Q is obtained by subtractor 48.

In DC voltage controller 40 (FIG. 6), deviation ΔVDC between DC voltage reference VDCr and DC voltage VDC is obtained by subtractor 42. In voltage command unit (FIG. 8), PI controller 52 is activated, and circulating current deviation ΔIzn is PI-controlled to generate AC voltage reference Vzn. AC voltage reference Vzn passes through selector 54 to be applied to each of adders 55 to 57. PI controller 51 is deactivated, and AC voltage reference Vzt is kept at zero.

In PI controller 53, deviations ΔVDC and ΔQ are PI-controlled to generate three phase AC voltage references V1r to V3r. In adder 55, AC voltage reference V1r and AC voltage reference Vzn are added to generate AC voltage reference Vuvr. In adder 56, AC voltage reference V2r and AC voltage reference Vzn are added to generate AC voltage reference Vvwr. In adder 57, AC voltage reference V3r and AC voltage reference Vzn are added to generate AC voltage reference Vvwr.

In gate signal generation circuits 60, 70, and 80 (FIGS. 9(A) to 9(C)), activation signal EN is asserted to "H", so that output signals φ64, φ74, and φ84 of OR gates 64, 74, and 84 go to "H" level, and each of AND gates 65, 66, 75, 76, 85, and 86 operates as a buffer.

Comparators 61, 71, and 81 compare the levels of three phase AC voltage references Vuvr, Vvwr, and Vwur with the levels of carrier signals Cuv, Cvw, and Cwu to generate signals φ61, φ71, and φ81. Signals φ61, φ71, and φ81 are delayed by buffers 62, 72, and 82 and passed through AND gates 65, 75, and 85 to become gate signals Auv, Avw, and Awu. Signals φ61, φ71, and φ81 are inverted by inverters 63, 73, and 83 and passed through AND gates 66, 76, and 86 to become gate signals Buv, Bvw, and Bwu.

All the inverters 10 in arms A1 to A3 are operated by these gate signals Auv, Buv, Avw, Bvw, Awu, and Bwu, circulating current Iz is set to circulating current reference Izrn, DC voltage VDC is set to DC voltage reference VDCr, and reactive power Q is set to reactive power reference Qr.

As described above, in the present embodiment, in a period during which power system 1 is cut off from three arms A1 to A3 (times t3 to t4 in FIG. 11), inverter 10 in each of three arms A1 to A3 is controlled such that circulating current Iz of three arms A1 to A3 follows circulating current reference Izrt, and it is determined whether the power conversion device is normal based on circulating current Iz in the period. Whether the power conversion device is normal therefore can be determined without affecting power system 1.

In the present embodiment, each of arms A1 to A3 includes multiple stages of unit converters 5. However, the invention of the subject application is applicable when each of arms A1 to A3 includes only a single stage of unit converter 5.

Figure 13:
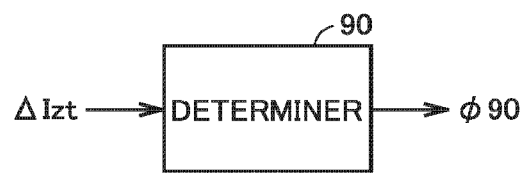
FIG. 13 is a block diagram showing a modification of the embodiment.

FIG. 13 is a block diagram showing a modification of the embodiment. In FIG. 13, in this modification, a determiner 90 is added to the power conversion device described above. Determiner 90 determines whether deviation ΔIzt (FIG. 3) between circulating current reference Izrt and circulating current Iz in the test mode exceeds the upper limit value, and outputs signal φ90 indicating the determination result. When deviation ΔIzt is smaller than the upper limit value, signal φ90 is deasserted to "L" level. When deviation ΔIzt is larger than the upper limit value, signal φ90 is asserted to "H" level. The user of the power conversion device determines that the power conversion device is normal if signal φ90 is at "L" level, and determines that the power conversion device is not normal if signal φ90 is at "H" level. In this modification, whether the power conversion device is normal can be easily determined.

The embodiments disclosed here should be understood as being illustrative in all respects and should not be construed as being limitative. The scope of the present invention is shown not in the foregoing description but in the claims, and it is intended that all modifications that come within the meaning and range of equivalence to the claims are embraced here.

REFERENCE SIGNS LIST 1 power system, 1u, 1v, 1w power transmission line, S1 to S6, S11 to S13 switch, 2, 3 transformer, R1 to R3 current-limiting resistor, UL, VL, WL AC line, C1 to C3 current detector, L1 to L3 reactor, A1 to A3 arm, 4 control device, 5 unit converter, 5a, 5b AC terminal, 10, 63, 73, 83 inverter, PL, NL DC line, 11 to 14 IGBT, 15 capacitor, 16 voltage detector, 17 driver, 20 circulating current controller, 21 Izrt generator, 22 Izrn generator, 23 46 calculator, 24, 25, 42, 48 subtractor, 31 pulse generator, 32 trapezoidal wave generator, 33 output setter, 34 sinusoidal wave generator, 35 multiplier, 36 signal generator, 40 DC voltage controller, 41 monitor voltage generator, 45 reactive power controller, 47 reactive power calculator, 50 voltage command unit, 51 to 53 PI controller, 54 selector, 55 to 57 adder, 60, 70, 80, gate signal generation circuit, 61, 71, 81 comparator, 62, 72, 82 buffer, 64, 74, 84 OR gate, 65, 66, 75, 76, 85, 86 AND gate, 90 determiner.

The invention claimed is:

1. A power conversion device comprising:
three arms that are delta-connected;
each of the three arms including
a capacitor configured to store DC power, and
an inverter configured to convert DC power into AC power;
a first controller configured to control the inverter of each of the three arms such that circulating current of the three arms follows a first reference in a test period in which a power system is cut off from the three arms; and
a second controller configured to control the inverter of each of the three arms such that electric power transferred between the power system and the three arms follows a second reference in normal operation in which there is electrical continuity between the power system and the three arms,
wherein it is determined whether the power conversion device is normal, based on the circulating current in the test period.

2. The power conversion device according to claim 1, further comprising three switches having respective first terminals receiving three phase AC voltage of the power system and respective second terminals connected to the three arms, the three switches being turned on in a charge period before the test period, turned off in the test period, and turned on in the normal operation,
wherein when the three switches are turned on in the charge period, current flows into the capacitor from the power system through the inverter, and DC power is stored into the capacitor.

3. The power conversion device according to claim 1, further comprising three current detectors configured to detect current flowing through the three arms,
  wherein the first controller is configured to obtain the circulating current based on detection values of the three current detectors and control the inverter such that the obtained circulating current follows the first reference.

4. The power conversion device according to claim 1, further comprising a signal generator configured to generate the first reference for a predetermined time in response to a test signal.

5. The power conversion device according to claim 4, wherein
  the first reference changes in a form of sinusoidal wave, and
  the signal generator is configured to gradually increase an amplitude of the first reference from a minimum value to a maximum value and thereafter gradually decrease the amplitude from the maximum value to the minimum value.

6. The power conversion device according to claim 1, wherein
  the first reference changes in a form of sinusoidal wave,
  when an amplitude and a phase of the circulating current change so as to follow the first reference, it is determined that the power conversion device is normal, and
  when an amplitude and a phase of the circulating current do not change so as to follow the first reference, it is determined that the power conversion device is not normal.

7. The power conversion device according to claim 1, further comprising a determiner configured to determine whether the power conversion device is normal based on a deviation between the circulating current and the first reference, and output a signal indicating a determination result.

8. The power conversion device according to claim 1, wherein
  each of the three arms includes a plurality of unit converters,
  each of the unit converters includes the capacitor and the inverter, and
  a plurality of the inverters are cascaded.

9. The power conversion device according to claim 1, wherein the power conversion device is used as a reactive power compensator configured to compensate for reactive power of the power system.

10. A method of testing a power conversion device comprising three arms that are delta-connected, each of the three arms including a capacitor configured to store DC power and an inverter configured to convert DC power into AC power, the power conversion device being configured to transfer electric power between a power system and the three arms in normal operation,
  wherein the inverter of each of the three arms is controlled such that circulating current of the three arms follows a reference in a test period in which the power system is cut off from the three arms, and it is determined whether the power conversion device is normal, based on the circulating current in the test period.

* * * * *